United States Patent
Wegmann et al.

(10) Patent No.: US 7,456,933 B2
(45) Date of Patent: Nov. 25, 2008

(54) METHOD FOR IMPROVING THE IMAGING PROPERTIES OF A PROJECTION OBJECTIVE FOR A MICROLITHOGRAPHIC PROJECTION EXPOSURE APPARATUS

(75) Inventors: Ulrich Wegmann, Koenigsbronn (DE); Vladimir Kamenov, Essingen (DE); Thomas Muelders, Erding (DE); Toralf Gruner, Aalen-Hofen (DE); Markus Mengel, Heidenheim (DE)

(73) Assignee: Carl Zeiss SMT AG, Oberkochen (DE)

( * ) Notice: Subject to any disclaimer, the term of this patent is extended or adjusted under 35 U.S.C. 154(b) by 427 days.

(21) Appl. No.: 11/220,643

(22) Filed: Sep. 8, 2005

(65) Prior Publication Data

US 2006/0077371 A1    Apr. 13, 2006

(30) Foreign Application Priority Data

Sep. 8, 2004   (DE)   ........................ 10 2004 043 280

(51) Int. Cl.
G03B 27/54    (2006.01)
G03B 27/72    (2006.01)

(52) U.S. Cl. .......................................... 355/67; 355/71
(58) Field of Classification Search .................. 355/67, 355/69, 53, 55, 71; 359/352, 494; 250/492.1
See application file for complete search history.

(56) References Cited

U.S. PATENT DOCUMENTS

| | | | |
|---|---|---|---|
| 5,337,097 A | 8/1994 | Suzuki et al. | |
| 6,285,443 B1 | 9/2001 | Wangler et al. | |
| 6,429,440 B1* | 8/2002 | Bleeker | 250/492.1 |
| 2002/0001088 A1 | 1/2002 | Wegmann et al. | |
| 2003/0016339 A1* | 1/2003 | Taniguchi | 355/69 |
| 2004/0114150 A1 | 6/2004 | Wegmann et al. | |
| 2004/0145714 A1* | 7/2004 | Poultney | 355/55 |
| 2004/0145806 A1* | 7/2004 | Hoffman et al. | 359/494 |
| 2005/0018278 A1* | 1/2005 | Ozawa | 359/352 |
| 2005/0146704 A1 | 7/2005 | Gruner et al. | |

FOREIGN PATENT DOCUMENTS

DE    103 04 822 A1    2/2004
JP    8-234138 A       9/1996

* cited by examiner

Primary Examiner—Peter B Kim
(74) Attorney, Agent, or Firm—Sughrue Mion, PLLC

(57) ABSTRACT

In a method for improving the imaging properties of a projection objective of a microlithographic projection exposure apparatus, an appropriate illumination angle distribution adapted to a mask (24; 224) to be projected is selected. Then locations (40a, 40b; 60a, 60b; 80a, 80b, 80c) in an exit pupil of the projection objective (20), which are illuminated under these conditions by projection light during a projection of the mask, are determined. For at least one image point, an actual value of an imaging quantity, e.g. a wavefront profile or a polarization state, is determined that influences the imaging properties of the projection objective. Finally, corrective measures are calculated such that the actual value of the imaging quantity approximates a desired value at these locations. In this last step, however, deviations of the actual value from the desired value are taken into account exclusively at said locations illuminated in the exit pupil.

39 Claims, 7 Drawing Sheets

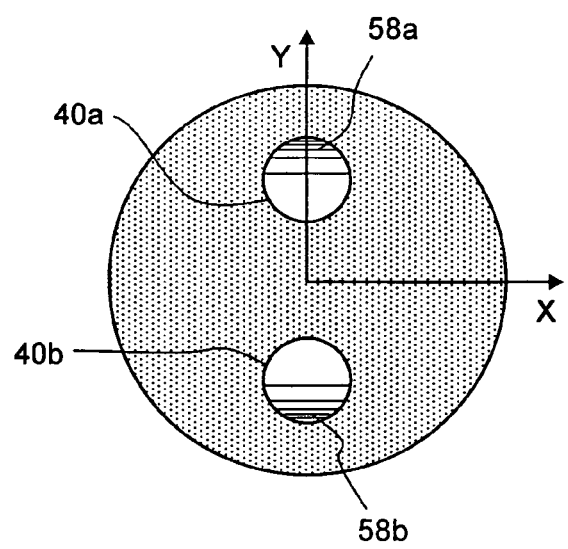
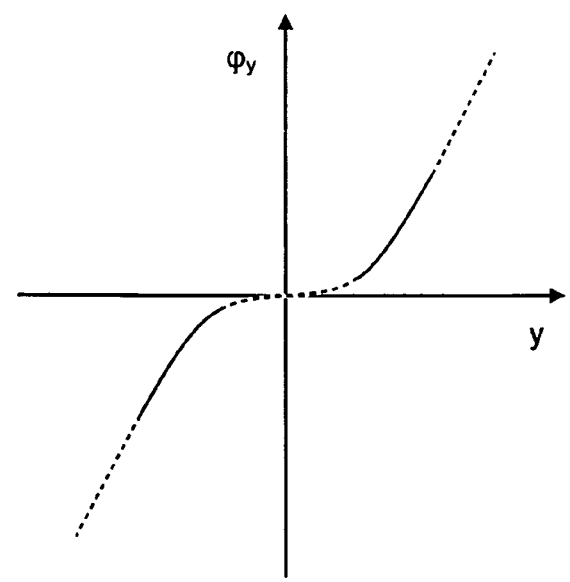
Fig. 3a　　　　　　Fig. 3b
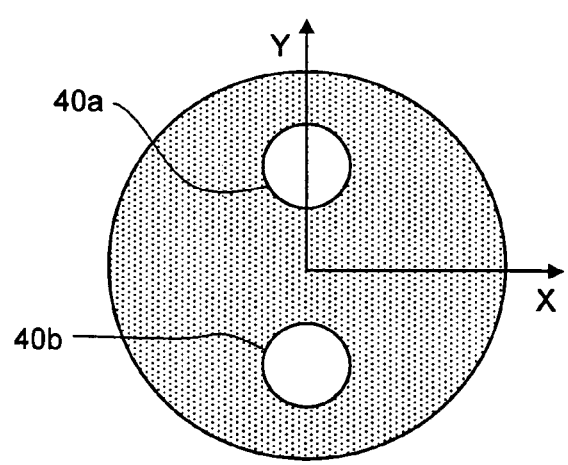
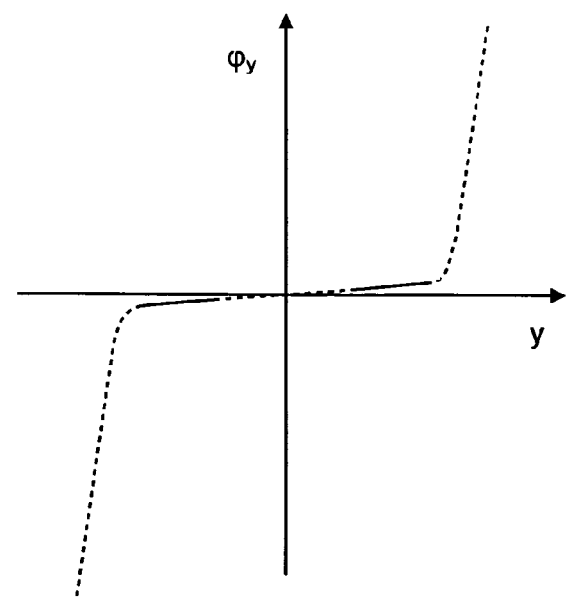
Fig. 5a　　　　　　Fig. 5b

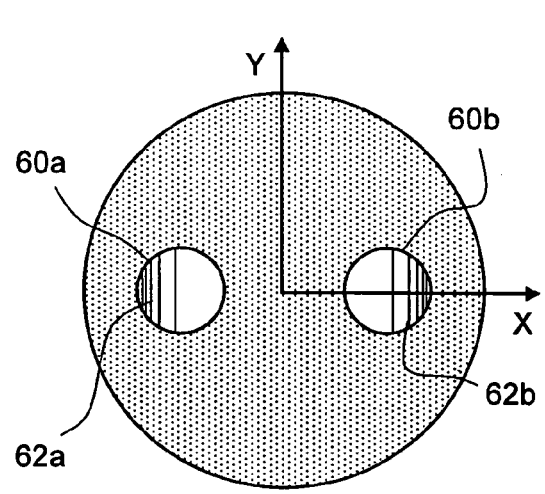
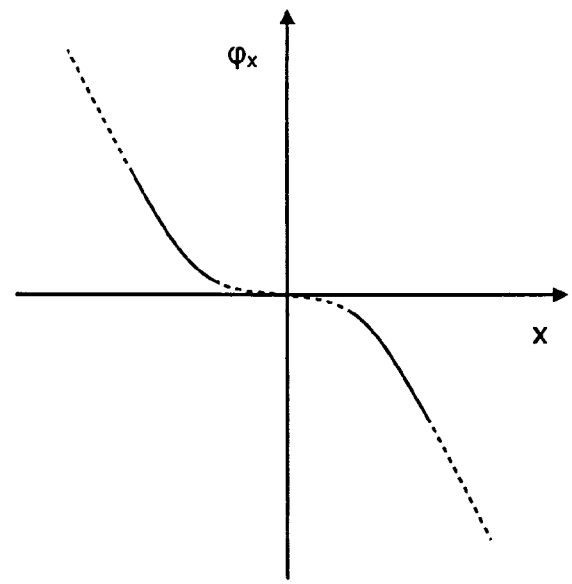
Fig. 6a　　　　　　Fig. 6b
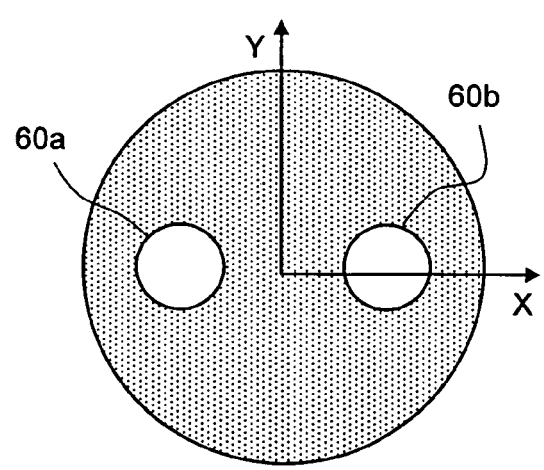
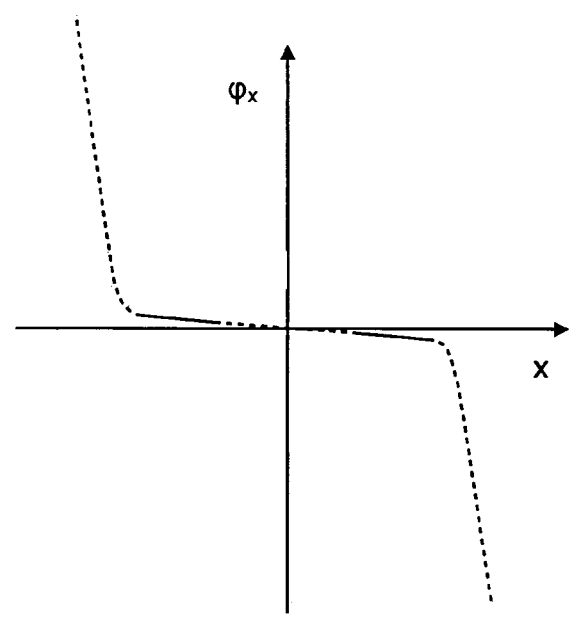
Fig. 7a　　　　　　Fig. 7b

METHOD FOR IMPROVING THE IMAGING PROPERTIES OF A PROJECTION OBJECTIVE FOR A MICROLITHOGRAPHIC PROJECTION EXPOSURE APPARATUS

BACKGROUND OF THE INVENTION

1. Field of the Invention

The invention relates to a method for improving the imaging properties of a projection objective for a microlithographic projection exposure apparatus. In particular, the invention relates to a method in which various quantities, which have an effect on the imaging properties of the projection objective, are determined in an exit pupil of the projection objective.

2. Description of the Prior Art

For the production of large-scale integrated electrical circuits and other microstructured components, a plurality of structured layers is applied on a suitable substrate which may be, for example, a silicon wafer. In order to structure the layers, they are first covered with a photoresist which is sensitive to light of a particular wavelength range, for example light in the deep ultraviolet (DUV) spectral range. The wafer coated in this way is subsequently exposed in a projection exposure apparatus. During the exposure, a pattern of structures contained in a mask is imaged onto the photoresist by a projection objective. Since the imaging scale is generally less than 1, such projection objectives are often also referred to as reduction objectives.

After the photoresist has been developed, the wafer is subjected to an etching or deposition process so that the top layer becomes structured according to the pattern on the mask. The remaining photoresist is then removed from the other parts of the layer. This process is repeated until all the layers have been applied on the wafer.

One of the most prominent aims in the development of microlithographic projection exposure apparatus is to be able to generate structures with smaller and smaller dimensions on the wafer, so as to increase the integration density of the components to be produced. One possible way of achieving this aim is to improve the imaging properties of the projection objective by various corrective measures. The imaging properties of the projection objective may be degraded by design or material faults, for example, but also by time-dependent changes of the optical elements contained in the projection objective. Examples for such time-dependent changes are heating effects during the projection operation and fluctuations of the pressure of the surrounding atmosphere.

Examples of suitable corrective measures are position changes of individual optical elements with the aid of manipulators. Such manipulators, which are known per se, make it possible for example to displace optical elements along the optical axis or perpendicularly to it, rotate them about the optical axis or tilt them perpendicularly to it. Deliberate bending of optical elements has also been proposed.

The performance of the projection exposure apparatus being used, however, is determined not only by the imaging properties of the projection objective, but also by the properties of an illumination system which directs a projection light beam at the mask to be projected. To this end, the illumination system contains a light source, for example a laser operated in pulsed mode, and a plurality of optical elements which transform the light delivered by the light source generate into a projection light beam with the intended properties. These properties include, inter alia, the illumination angle distribution over the cross section of the projection light beam, i.e. the angular distribution of the light rays which constitute the projection light beam.

A very important point in this regard is generally the illumination angle distribution of the projection light beam in the plane where the mask to be produced is placed during the projection operation. If the illumination angle distribution is specially adapted to the pattern contained in the mask, the latter can be more accurately imaged onto the photoresist on the wafer.

The illumination angle distribution in the object plane where the mask to be projected is placed is often not described as such, but as an intensity distribution in a conjugate pupil plane. This utilizes the fact that each angle with respect to the optical axis, at which a light ray passes through a field plane, can be assigned a radial distance measured from the optical axis in a conjugate pupil plane. In the case of a so-called conventional illumination setting, for example, the region illuminated in such a pupil plane is a circular disc concentric with the optical axis. Each point in the field plane is therefore struck by light rays at angles of incidence of between 0° and a maximum angle dictated by the radius of the circular disc. In the case of so-called unconventional illumination settings, for example ring field, dipole or quadrupole illumination, the region illuminated in the pupil plane has the shape of a ring concentric with the optical axis, or a plurality of individual regions which are arranged away from the optical axis. With these unconventional illumination settings, therefore, the mask to be projected is always illuminated obliquely.

Methods for the improvement of imaging are known in which the profile of the wavefront, i.e. the phase distribution, is separately measured for each field point (point in the image plane) with the aid of a wavefront detector in the exit pupil. The projection objective can then be corrected with the aid of manipulators, for example so that the mean-square overall wavefront error for all the field points is minimal throughout the exit pupil. Other optimization concepts are also known. For example, it has been proposed to carry out correction with the condition that the measured wavefront deformation must not exceed a predetermined amount for any field point.

U.S. Pat. No. 5,337,097 A discloses a method in which, for imaging correction, the barometric pressure in the projection objective is changed as a function of the illumination angle distribution which has been set. This is based on the idea that the spatial distribution of the heat input into the optical elements of the projection objective depends on the illumination distribution which has been set. Different temperature distributions in an optical element lead to correspondingly different imaging errors, so that the required corrective measures depend on the illumination angle distribution which has been set.

It has been found, however, that these known measures for improving the imaging quality are often insufficient for very accurately imaging fine structures in the mask onto the photosensitive layer.

SUMMARY OF THE INVENTION

It is therefore an object of the invention to provide a method for improving the imaging properties of a projection objective for a microlithographic projection exposure apparatus so that even very small structures can be imaged with a high accuracy on the photosensitive layer.

According to one formulation of the invention, this and further objects are achieved by a method including:

a) providing a mask to be projected;

b) determining locations in an exit pupil of the projection objective which are illuminated by projection light during a projection of the mask;

c) determining, for at least one image point of the projection objective, an actual value of an imaging quantity at least at the locations determined according to step b), wherein the imaging quantity influences the imaging properties of the projection objective;

d) calculating corrective measures such that the actual value of the imaging quantity approximates a desired value of the imaging quantity at the locations determined according to step b), wherein deviations of the actual value from the desired value are taken into account exclusively at the locations determined according to step b); and e) implementing the corrective measures.

The invention is based on the idea that a mask can be projected more accurately onto a photosensitive layer if the improvement of the imaging properties is restricted only to the regions of an exit pupil in the projection objective which are in fact illuminated for a given mask and a specific illumination angle distribution set by the illumination system. An optimization which is restricted to the actually illuminated regions of an exit pupil can lead to very different corrective measures than is the case for optimization in which the entire illuminable exit pupil is always included in the optimization.

The method according to the invention therefore sometimes leads to corrective measures which would cause intolerably large deviations of the actual value from the desired value at certain locations in the exit pupil for a different mask and/or a different illumination angle distribution. However, if these locations are not in fact illuminated with a given mask and a given illumination angle distribution, then these deviations cannot actually have a perturbing effect on the imaging.

If the projection exposure apparatus has an illumination system by which projection light with different illumination angle distributions can be generated, then an illumination angle distribution adapted to the mask is preferably selected before step b), and this is taken into account when determining the locations according to step b).

The actual value of the imaging quantity may be determined either by means of a measurement or by means of a simulation. A measurement has the advantage that unknown perturbations which degrade the imaging quality can be considered as well. In cases when the actual value can be measured only with difficulty, however, a simulation may be more expedient. A simulation should also be performed when the method is being carried out not in the context of correcting an existing projection objective, but in the context of designing a projection objective which has yet to be produced. Use of the method as a design tool has the advantage that there are then substantially more available corrective measures which can be used to make the actual value of the imaging quantity approximate the desired value for the at least one image point. For example, this may also involve the selection of the optical materials used.

If the imaging quantity is a wavefront profile (phase distribution) in an exit pupil of a particular image point, then the wavefront profile may, for example, be measured using wavefront detectors which are known as such in the art. For instance, wavefront detectors are suitable for this which operate according to the principle of a Hartmann sensor and register the measurement information in the form of an exposure in the photoresist.

In this context, however, it is particularly advantageous to use a shearing interferometer for this measurement. In such an measurement, a diffraction grating is arranged in the image plane of the projection objective, and an interference pattern generated by the grating is detected in an electronic image detector. Such wavefront detectors permit wavefront determination virtually in real-time so that the method according to the invention may, for example, be used when the projection operation has to be interrupted, for instance because the masks need to be replaced. Rapid determination of the wavefront in the image plane with the aid of such wavefront detectors even makes it possible to carry out steps c) to e) in an exposure pause between two exposures. In this way, it is also possible to correct those imaging errors which do not occur until during projection operation of the apparatus. These may, for example, be due to changes of the temperature distribution in the optical elements, as already mentioned above.

Since the projection operation must be interrupted for a time, even if only a short time, for the measurement, the analysis of the projection objective according to step c) should be carried out only as often as is necessary with regard to the time-varying conditions in the projection objective, in particular the temperature distribution.

For a photosensitive layer onto which different masks (in specific cases just a single mask) are intended to be projected several times in succession with differently set illumination angle distributions, steps b) to d) may be carried out at least occasionally between changes of the illumination angle distribution and step e) may be carried out between each change of the illumination angle distribution. Here again, the frequency with which an analysis of the projection objective is carried out will be adapted to the rate at which the optically relevant conditions, for example the temperature distribution, vary significantly in the projection objective.

If rapid determination of the actual value of the imaging quantity is not possible or is not intended, or if adaptation to the progressively varying conditions in the projection objective is not required, then, in the case of multiple exposure, steps b) to d) may be carried out once for each illumination angle distribution before commencing the projection operation. During the projection operation, only step e) then needs to be carried out between each change of the illumination angle distribution.

The corrective measures according to steps d) and e) may in principle be any changes which affect the imaging properties of the projection objective. Suitable examples include a position or shape change of at least one optical element contained in the projection objective, or of the mask to be projected.

To this end, the prior art discloses manipulators which make it possible for the relevant optical element or even the mask to be translated in the X, Y and/or Z direction, rotated and tilted or bent.

For the correction, it is also possible to change a diaphragm aperture in the projection objective. A still further corrective measure comprises the step of deliberately varying the pressure of a gas mixture which lies between the optical elements of the projection objective.

Besides this, corrective measures which lead to a change of the illumination angle distribution generated by the illumination system are also contemplated. Such a change may be considered if it is possible to displace the locations illuminated in the exit pupil to locations where it is easier to make the actual value of the imaging quantity approximate the desired value. With reference to the example of wavefront profiles, for example, this may involve that the illumination angle distribution is changed so that regions in the exit pupil of the projection objective, where the actual wavefront profile differs from the desired wavefront profile beyond a predetermined amount, are no longer illuminated.

The illumination angle distribution may, for example, be changed by a transmission filter which is arranged in or in close proximity to a pupil plane in the illumination system. As an alternative or in addition to this, it is possible to change the positions of axicon elements, lenses or prisms which are often provided for generating an intended illumination angle distribution in the illumination system.

After the corrective measures previously determined by calculation have been implemented according to step e), it may be advantageous to carry out a control measurement by determining again the value of the imaging property, e.g. the actual wavefront profile, according to step c). In this way, it is possible to verify whether the implemented corrective measures do indeed lead to the intended improvement of the imaging of the mask onto the photosensitive layer.

The imaging quantity may be a quantity that characterizes the polarization state of the projection light. It has been found that the achievable contrast and therefore the minimum size of the structures to be generated with projection objectives of high numerical apertures, for instance those achieved by immersion objectives, depend on the polarization direction of the projection light. This is attributable to the fact that the intended interference phenomena between different diffraction orders are commensurately more pronounced as the polarization states of the interfering diffraction orders are similar. Full interference between two plane waves is possibly only if they have identical states of polarization.

The polarization state which is preferred in a specific case depends, inter alia, on the mask to be projected and the type of projection objective used. For some projection objectives, it is more expedient for the projection light to be circularly polarized in the exit pupil. For other projection objectives, however, the projection light should be unpolarized in the exit pupil.

Perturbations of the intended polarization in the exit pupil may be caused by various factors. Examples of relevant causes include the polarization dependency of reflective layers or the birefringence of some lens materials. The latter point is of particular importance when very short projection light wavelengths are used. In that case, it is becoming increasingly common to use lenses made of fluorspar ($CaF_2$) since these crystals still have a high optical transparency even at very short projection light wavelengths, for example 157 nm. At such short wavelengths, however, fluorspar is by its very nature (i.e. intrinsically) birefringent; birefringence due to mechanical stresses may occur in addition. Although various measures for reducing the birefringence of fluorspar lenses are known, full compensation for perturbations of the polarization distribution over the cross section of the polarization light beam is nevertheless generally impossible. If these perturbations remain uncompensated, then the direction dependency of the contrast of the projection objectives changes. This has an unfavorable effect on the size of the structures that can then be produced with such apparatus, and may furthermore lead to undesirable structure width variations.

By corrective measures to be implemented after the apparatus has been put into operation, or even by suitable measures in the context of designing the projection objective, the invention now makes it possible to achieve a significant improvement of the polarization properties. Here again, what is crucial is that only the regions actually illuminated in the exit pupil are considered when these measures are determined.

If the quantity characterizing the polarization state is not to be determined by simulation, but is intended to be measured, then it is suitable to use known polarization analyzer arrangements which contain a pupil-resolving polarization detector. These arrangements make it possible to determine the Jones matrix in the exit pupil, from which all the quantities characterizing the polarization state can be derived. Which quantity is most suitable in a specific case, depends inter alia on the polarization state which is intended in the exit pupil. If the polarization light is meant to be circularly polarized in the exit pupil, then the differences between the amplitudes and between the phases of orthogonal polarization states may be used to describe the ellipticity.

If the locations determined in step b) are arranged at least approximately point symmetrically with respect to an optical axis, and in particular approximately on a diameter through the exit pupil, then a significantly higher contrast on the photoresist is often achieved if the values of the actual quantities are at least approximately identical at the locations determined in step b).

BRIEF DESCRIPTION OF THE DRAWINGS

Other features and advantages will be found in the following description of the exemplary embodiments with reference to the drawing, in which:

FIG. 3a shows an exit pupil of the projection objective according to FIG. 1, in the case of a first dipole illumination without corrective measures;

FIG. 3b shows a phase diagram for the wavefront profile in the Y direction in the illuminated regions of the exit pupil shown in FIG. 3a;

FIG. 5a shows the pupil plane of FIG. 3a after the corrective measures have been implemented;

FIG. 5b shows the phase diagram of FIG. 3b after the corrective measures have been implemented;

FIG. 6a shows the exit pupil in the case of a second dipole illumination, rotated through 90° relative to the first, without corrective measures;

FIG. 6b shows a phase diagram for the wavefront profile in the X direction in the illuminated regions of the exit pupil shown in FIG. 6a;

FIG. 7a shows the pupil plane of FIG. 6a after the corrective measures have been implemented;

FIG. 7b shows the phase diagram of FIG. 6b after the corrective measures have been implemented;

DESCRIPTION OF PREFERRED EXEMPLARY EMBODIMENTS

Figure 1:
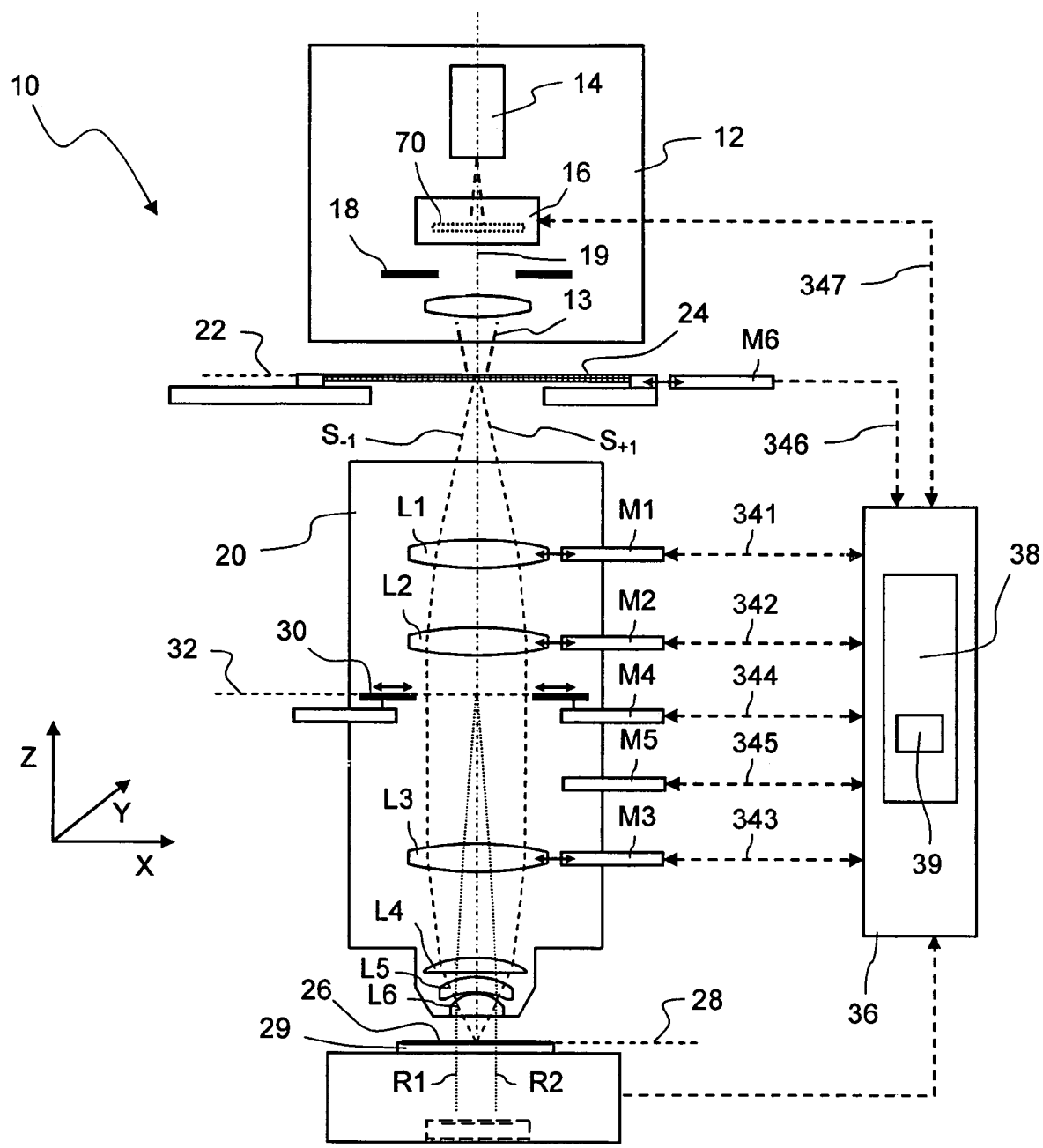
FIG. 1 shows a meridian section through a projection exposure apparatus according to the invention in projection mode, in a highly schematized representation.

FIG. 1 shows a meridian section through a microlithographic projection exposure apparatus, denoted overall by 10, in a highly schematized representation which is not true to scale. The projection exposure apparatus 10 has an illumination system 12 for generating projection light 13, which comprises a light source 14, illumination optics indicated by 16 and a diaphragm 18. The illumination optics 16 make it possible to set different illumination angle distributions. To this end, for example, the illumination system may contain interchangeable diffractive optical elements or microlens arrays. Besides this, the illumination optics 16 may also contain axicon elements, lenses or prisms which are arranged so that they can be displaced along the optical axis 19. Since such illumination optics are known in the prior art, see for example U.S. Pat. No. 6,285,443 A, further details of these will not be explained.

The projection exposure apparatus 10 also has a projection objective 20 which contains a multiplicity of lenses, only some of which denoted by L1 to L6 are represented by way of example in FIG. 1 for the sake of clarity. The projection objective 20 is used to project a reduced image of a mask 24, which can be arranged in an object plane 22 of the projection objective 20, onto a photosensitive layer 26 which, for example, may be a photoresist applied on a wafer 29.

In the exemplary embodiment represented, the lenses L1, L2 and L3 are assigned manipulators M1, M2 and M3, which can change the optical action of the lenses L1, L2 and L3. The manipulator M1 can displace the lens L1 precisely in the X and Y plane with a high accuracy. The manipulator M2 allows a position change in the direction perpendicular thereto, i.e. along the Z axis. The manipulator M3 comprises actuating elements which can bend the lens L3.

A further manipulator M4 makes it possible to adjust a variable diaphragm 30, which is arranged in a pupil plane 32 of the projection objective 20. A manipulator M5 can change the barometric pressure inside a part of a projection objective 20, so that the optical properties of the optical elements exposed to this pressure can be changed. A further manipulator M6 makes it possible to displace the mask 24 along the Z axis. Since the manipulators M1 to M6 described above are known per se in the prior art, further details of these will not be explained.

The manipulators M1 to M6 are connected via signal lines 341 to 346 to a control unit 36, which can drive the individual manipulators M1 to M6 in a controlled way. To this end, the control unit 36 comprises a computer 38 which, using a method which is to be explained below, determines the control instructions that should be sent to the manipulators M1 to M6 in order to improve the imaging properties of the projection objective 20.

The control unit 36 is furthermore connected via a further control line 347 to the illumination optics 16, so that the control unit 36 can also influence the illumination angle distribution of the projection light.

The projection objective 20 represented here by way of example is telecentric on the image side. This means that the exit pupil lies at infinity. The term exit pupil refers to the image-side image of the entry diaphragm, which in this case is the diaphragm 30. In FIG. 1, rays R1, R2 represented by dots indicate how points in the pupil plane 32, in which the diaphragm 30 is arranged, are imaged at infinity by the subsequent lenses L3 to L6.

Even with careful mounting and adjustment of the projection objective 20, it will generally have imaging errors which degrade the imaging of the mask 24 onto the photosensitive layer 28. The causes of the imaging errors can differ. On the one hand, there are imaging errors which result from the design of the projection objective 20, i.e. in particular from the specification of the dimensions, materials and spacings of the optical elements contained in the projection objective 20. One example of this is the intrinsic birefringence of calcium fluoride ($CaF_2$), which becomes increasingly noticeable at wavelengths of less than 200 nm. The effect of birefringence is generally to change the polarization state of the projection light in an undesirable way when it passes through the birefringent material.

On the other hand, there are imaging errors which are attributable to production or material defects and which it is generally sensible to correct only once the projection objective has finally been mounted. Examples of production defects include so-called form defects, which are intended to mean deviations from surface accuracy in the case of optical surfaces. Material errors, however, do not generally affect the condition of refractive or reflective surfaces, but usually lead to inhomogeneous refractive index profiles or locally varying birefringence properties inside the optical elements. Such material defects may sometimes not occur until during the service life of the projection objective 20. The causes of this are irreversible modifications of the materials, which are generally due to the energetic projection light.

Lastly, there are also imaging errors which do not occur until during the projection operation but are reversible in nature, and therefore fade away again after the end of the projection operation. The most important cause of such imaging errors is the heat input by projection light, which leads to an often inhomogeneous temperature distribution and therefore a concomitant shape change of the optical element, which is usually not rotationally symmetrical.

A method which can at least partially correct those of the aforementioned imaging errors which lead to deformations of the wavefront will be described below with reference to a first exemplary embodiment. In the method, the requisite corrective measures are adapted individually to the mask 24, with which a pattern contained in it is intended to be projected onto the photoresist 26, and to an illumination angle distribution specially selected for this mask 24.

Figure 2:
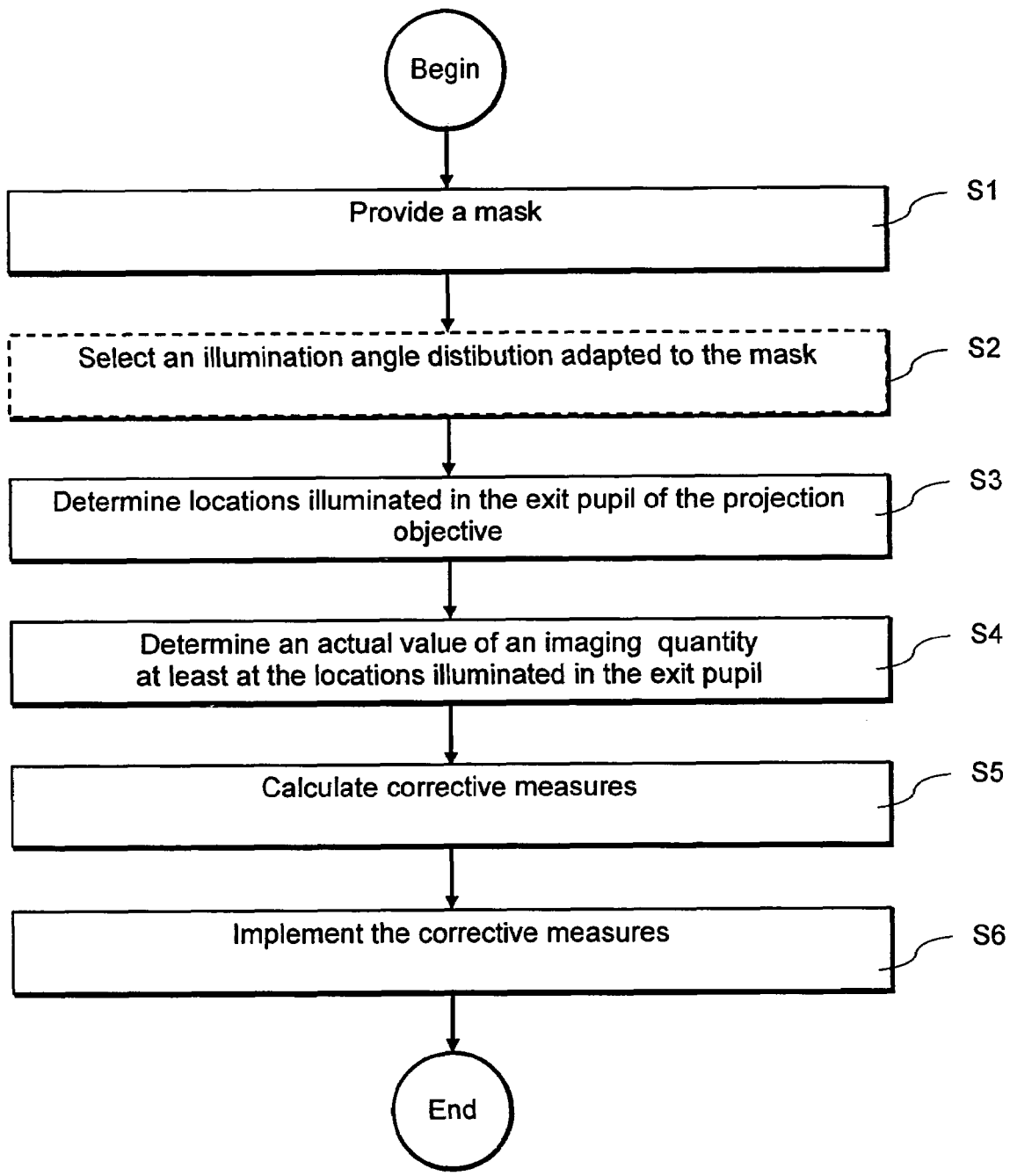
FIG. 2 shows a flow chart to explain the method according to the invention according to a first exemplary embodiment.

The start of the method, which will be explained below with reference to the flow chart shown in FIG. 2, therefore involves the provision of a mask in a first step S1. An illumination angle distribution adapted to the mask is selected in a second step S2. This selection is generally dictated by the orientation and size of the structures contained in the mask. This second step S2 is optional, and it is omitted for projection exposure apparatus whose illumination system does not allow the illumination angle distribution to be influenced.

It will be assumed below that the photoresist 26 is exposed twice in succession, and with different masks. A first mask contains structures which are oriented in the X direction, while a second mask contains structures which are oriented in the Y direction. The illumination angle distribution is adapted to the two masks, so that it is necessary to change the illumination angle distribution between the projections. In the present exemplary embodiment, these two illumination angle distributions are different dipole illuminations.

If the mask 24 with the structures oriented in the X direction is intended to be projected first, then a dipole illumination whose poles in the exit pupil lie on a diameter in the Y direction is set up. In a step S3, the locations in the exit pupil of the projection objective 20 which are illuminated through the mask 24 with the initially set dipole illumination are then determined. To this end, it is necessary to find the diffraction orders which the first mask 24 generates when the projection light having the selected illumination angle distribution passes through it, by means of simulation calculations which are known per se. In FIG. 1, it is assumed that only the diffraction orders m=+1 and m=−1 are generated by the first mask 24 with the selected illumination angle distribution. These diffraction orders, which are indicated by way of example in FIG. 1 by rays $S_{-1}$ and $S_{+1}$, pass through the projection objective 20. Since its imaging properties are at least essentially known because of the prearranged objective design, it is possible to determine the locations where the diffraction orders $S_{-1}$ and $S_{+1}$ illuminate the exit pupil.

In FIG. 3a, the exit pupil 32 is shown as a disc with a grey background. For the sake of simplicity, it is assumed here that the structures contained in the first mask 24 are periodic in such a way that the diffraction orders $S_{-1}$ and $S_{+1}$ respectively fill one of the two poles which are generated by the illumination optics 16. The two illuminated regions will be denoted by 40a, 40b below.

Now, in a fourth step S4, the actual wavefront profile in the exit pupil is determined as a quantity to be optimized for at least one, but preferably a multiplicity of suitably selected field points (points in the image plane). The profile which a light wave, converging on the relevant field point, has in the exit pupil is in this case measured for each of the selected field points, independently of one another.

Figure 4:
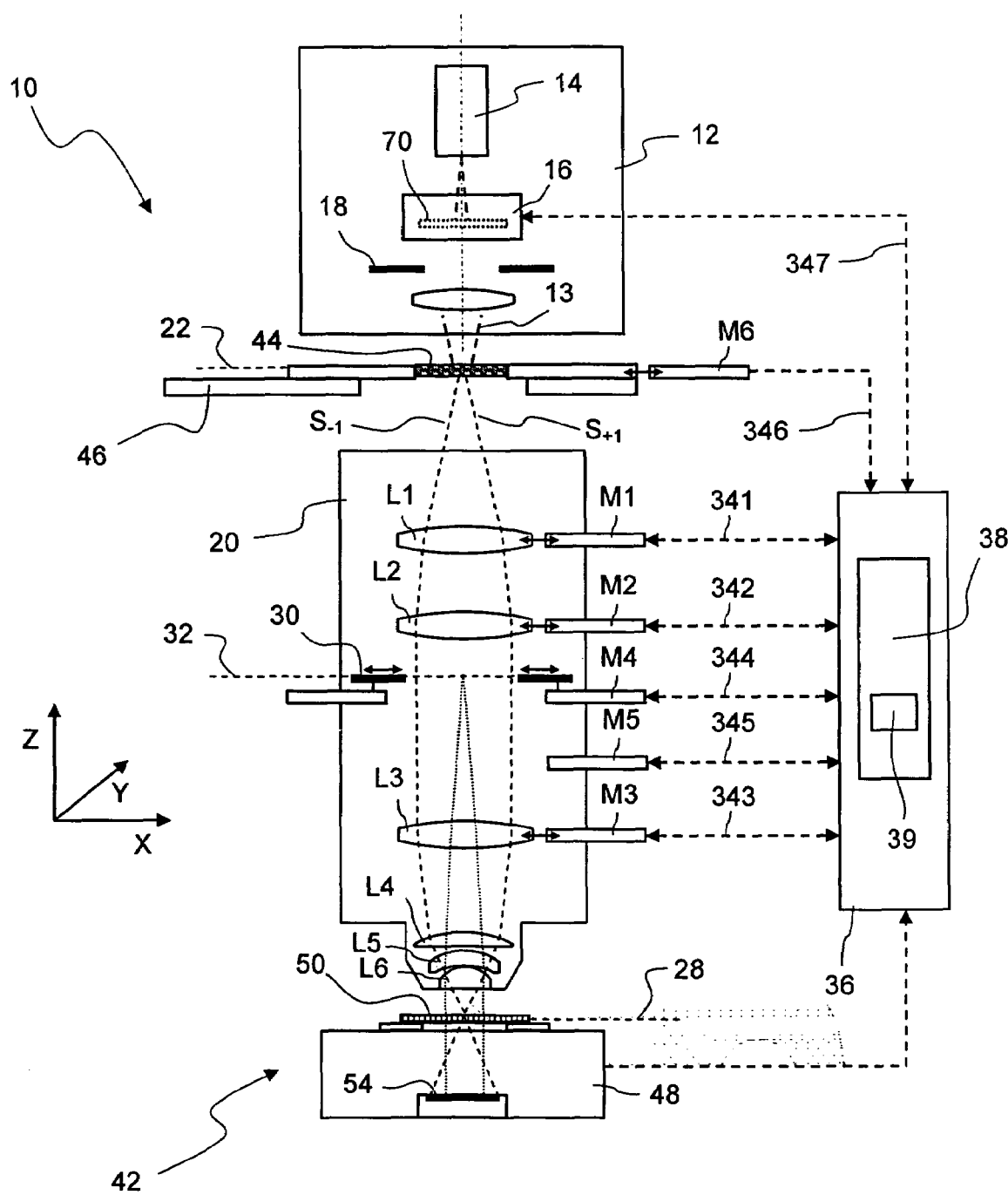
FIG. 4 shows the projection exposure apparatus as shown in FIG. 1, in measurement mode.

For this purpose, the projection exposure apparatus is changed over from the projection mode shown in FIG. 1 to a measurement mode, which is shown in FIG. 4. A shearing interferometer 42, which allows very rapid analysis of the projection objective 20, is integrated in the projection exposure apparatus 10. To this end, the shearing interferometer 42 uses the illumination system 12 and a special test mask 44 which, when changing over to the measurement mode, is introduced into the object plane 22 with the aid of a first displacement device 46 known per se (a so-called reticle stage) in place of the mask 24 to be projected.

Using a second displacement device 48 (a so-called wafer stage) which can displace the wafer 29 in the image plane 28, the wafer 29 is simultaneously replaced by a diffraction grating 50. Other parts of the shearing interferometer 42, inter alia the photosensitive sensor 54 which may for example be a CCD chip, are arranged inside the displacement device 48. The function of the shearing interferometer 42 is known per se in the prior art, cf. for example US 2002/0001088 A1 in the name of the Applicant, the disclosure of which is hereby fully incorporated into the present application. Further details need not therefore be explained here.

For the selected field points, the shearing interferometer 42 makes it possible to find the wavefront in the exit pupil. The greater the imaging errors in the projection objective 20 are, the more the wavefront measured in the exit pupil for a field point will deviate from the ideal waveform. For the measurement, the object plane 22 is illuminated so that spherical waves emanate there from the individual field points. The ideal waveform in the exit pupil is then an aberration-free wave for each field point.

In the present exemplary embodiment, it will be assumed that a wavefront deformation due to imaging errors, i.e. deviation from the ideal aberration-free wave, can be described in the exit pupil for a particular field point by a Zernike polynomial $Z_{10}$. Such a wavefront deformation with threefold symmetry cannot be corrected straightforwardly by conventional manipulators. But since only the regions 40a, 40b will subsequently be illuminated by projection light during the projection of the first mask 24 with the initially selected illumination angle distribution in the exit pupil, it is not necessary to correct the wavefront over the entire exit pupil that can in principle be illumined. Rather, it is sufficient merely to reduce the wavefront deformation in the regions 40a, 40b actually illuminated.

In FIG. 3a, the wavefront deformations inside these regions 40a, 40b are indicated by shading 58a, 58b. The phase diagram shown in FIG. 3b shows the phase deviation $\phi_y$ in a section in the Y direction through the exit pupil. Continuous lines represent the phase deviations $\phi_y$ inside the regions 40a, 40b, whereas dotted lines indicate the phase deviations $\phi_y$ outside this region.

For an ideal aberration-free wave, the phase deviations $\phi_y$ would be identically zero over the entire exit pupil. The computer 38 in the control unit 36 of the projection exposure apparatus 10 now compares the determined wavefront profile with a desired wavefront profile in a comparator 39, and in a fifth step S5, on the basis of the ascertained deviations, calculates corrective measures which can reduce the wavefront deformations for the relevant field point inside the regions 40a, 40b. What is crucial in this context is that this comparison is restricted exclusively to the actual wavefront profile inside the regions 40a, 40b actually illuminated in the exit pupil; the parts of the wavefront lying outside these regions are ignored.

The measures required for this in a specific case are known per se in the prior art. In the present case, for example, the manipulators M1 to M6 may be driven so that a compensating deformation with an opposite effect, which can be described as a superposition of the Zernike polynomials $Z_2$ and $Z_7$, is imposed on the wavefront in the projection objective 20. If the exit pupil were to be fully illuminated, this could even exacerbate the wavefront deformations outside the regions 40a, 40b due to the compensating deformation generated by the manipulators M1 to M6. Yet since projection light does not pass through the zones of the exit pupil lying outside the regions 40a, 40b with the particular first mask 24 and the illumination angle distribution which has been set, the manipulators M1 to M6 provide a very good correction of the wavefront in the regions 40a, 40b of the exit pupil.

This is shown in FIGS. 5a and 5b, where the exit pupil and a phase diagram corresponding to FIG. 3b are shown after the corrective measures previously calculated in step S5 have been implemented in a sixth step S6. There is virtually no more wavefront deformation in the regions 40a, 40b, as is indicated in FIG. 3a by the lines 58a, 58b. The continuous lines in the phase diagram of FIG. 5b show that there are now only very minor phase differences over the extent of the regions 40a, 40b in the section in the Y direction. It is furthermore clear from FIG. 5b that the correction with the aid of the manipulators M1 to M6 has in fact caused the phase differences to increase at the edge lying outside the regions 40a, 40b on the section in the Y direction. In the case of conventional optimization, such a correction will be unacceptable because the phase differences averaged over the entire exit pupil would overall be greater after the correction than before the correction.

It should be understood that not all the manipulators M1 to M6 must be actuated in order to correct the wavefront deformations. Since the effect which the individual manipulators M1 to M6 have on the wavefront is known, once the wavefront deformation in the regions 40a, 40b has been established the computer 38 can send the appropriate control instructions to the manipulators M1 to M6 via the signal lines 341 to 346.

As an alternative or in addition to actuating the manipulators M1 to M6, the illumination angle distribution may also be changed by sending appropriate control instructions via the signal line 347 to the illumination optics 16 of the illumination system 12. For example, if it is found in step S4 that the wavefront deformations inside the regions 40a, 40b cannot straightforwardly be reduced by the intended amount with the aid of the manipulators M1 to M6, then changing the illumination angle distribution provides the opportunity to change the size or position of the regions 40a, 40b inside the exit pupil. This sometimes makes it possible to shift the illuminated regions in the exit pupil to positions where the wavefront deformations are smaller or can be remedied more easily with the aid of the manipulators M1 to M6. Since this generally entails a departure from the optimum illumination angle distribution for the first mask 24, the advantages associated with-changing the illumination angle distribution must be weighed up against the accompanying disadvantages.

In order to change the illumination angle distribution, the computer 38 may also cause the introduction of a transmission filter 70 (see FIG. 1) into a pupil plane of the illumination system 12, if the possibilities already available for adjustment are not sufficient.

The correction restricted to the regions actually illuminated in the exit pupil was explained above only for the wavefront with respect to a single field point. In general, however, it is necessary to achieve a high image quality over the entire image field used. Step S4 is therefore repeated, and the deviations from the desired wavefront are determined, for all the selected field points. An optimization process is then used to determine corrective measures which lead to an improvement in the imaging properties of the projection objective when all the selected field points are included. The optimization may, for example, be carried out with the condition that the deviations of the actual wavefronts from the desired wavefronts are minimal on average for all the selected field points, or that the deviations must not exceed a particular upper limit for any field point. The corrective measures which have been found in the course of such an optimization, by including all the field points, are then actually implemented in step S6.

Another analysis of the projection objective 20 corrected in step S6 is then preferably carried out with the aid of the shearing interferometer 42, in order to check whether the respective wavefront profile in the regions 40a, 40b has indeed approximated the ideal profile to the required extent for the selected field points. If so, then the first exposure of the photoresist 26 can be carried out with the illumination angle distribution which has been set.

The second projection is then carried out with the second mask. To this end, a dipole illumination whose poles in the exit pupil lie on a diameter in the X direction is set up. Again, the following explanations will firstly consider only the wavefront assigned to a single field point.

FIG. 6a shows a representation of the exit pupil, corresponding to FIG. 3a, in which the illuminated regions 60a, 60b likewise coincide with the poles generated by the illumination optics 16. As mentioned above, however, the regions 60a, 60b are arranged equidistant from the optical axis not in the Y direction as in FIG. 3a, but in the X direction. The measurement of the actual wavefront profile inside the regions 60a, 60b according to step S4, for the field point considered here, in this case gives another wavefront deformation as indicated by the shading 62a, 62b in FIG. 6a. FIG. 6b, in which the phase difference $\phi_x$ inside the region 60a is plotted along the X direction, therefore differs from the phase difference $\phi_y$ as plotted in FIG. 3b.

In order to reduce the wavefront deformation in the regions 60a, 60b as indicated in FIGS. 6a and 6b, the computer 38 now calculates suitable corrective measures according to step S5. These corrective measures may differ significantly from those which were found in order to correct the wavefront deformations in the regions 40a, 40b for the other illumination angle distribution.

FIGS. 7a and 7b show the exit pupil and a phase diagram corresponding to FIG. 6b, as obtained after the corrective measures have been implemented according to step S6. The phase differences $\phi_x$ inside the regions 60a, 60b have thereby been reduced significantly. The explanations given above with reference to FIGS. 3a, 3b and 5a, 5b apply here accordingly.

The corrective measures calculated for the two illumination angle distributions are stored in the computer 38 and can then be implemented in a short time whenever the illumination angle distribution is changed. Specifically, this means that a first illumination angle distribution is set up with the aid of the illumination optics 16 before the first mask 24 is exposed, for example a dipole illumination with poles lying next to each other along the Y direction as shown in FIG. 3a. At the same time, the corrective measures stored for this illumination angle distribution are called up from the computer 38. The control unit 36 then drives the manipulators M1 to M6, and optionally the illumination optics 16, via the signal lines 341 to 347 so that the wavefront deformations in the regions 40a, 40b of the exit pupil are improved. Only then is the exposure of the first mask 24 carried out.

The second mask is subsequently introduced into the beam path, and the illumination optics 16 are read-justed so that they generate the dipole illumination shown in FIG. 6a, with poles lying next to each other along the X direction. The corrective measures previously found for this second illumination angle distribution are now called up from the computer 38. The control unit 36 then sends appropriate control instructions via the signal lines 341 to 347 to the manipulators M1 to M6, and optionally to the illumination optics 16. By means of this, the projection objective 20 is now corrected so that the wavefront profile is improved inside the regions 60a, 60b which are illuminated with this illumination angle distribution in the exit pupil. Only after these corrective measures have been implemented is the exposure of the second mask carried out with the second illumination angle distribution now set up. The next region on the wafer 29 can now be exposed with this illumination angle distribution. The first mask is then reintroduced into the beam path, the first illumination angle distribution is resumed and the projection objective 20 is optimally corrected in the manner found for this.

If the emission properties of the projection objective can also change significantly during the projection mode, for example because the mask to be projected lets a very great deal of projection light enter the projection objective, and the optical elements contained in it are therefore heated strongly, then it may be expedient that the measurements required for determining the actual wavefront profile according to step S4 should be repeated more frequently in brief exposure pauses. The new corrective measures possibly derived therefrom according to step S5 are then implemented until the next analysis of the projection objective 20 has found new corrective measures, for example with the aid of the shearing interferometer.

A second exemplary embodiment will be explained in detail below with reference to FIGS. 8 to 12.

In the second exemplary embodiment, the quantity which the corrective measures affect is not the wavefront profile but a quantity characterizing the polarization state of the projection light.

Figure 8:
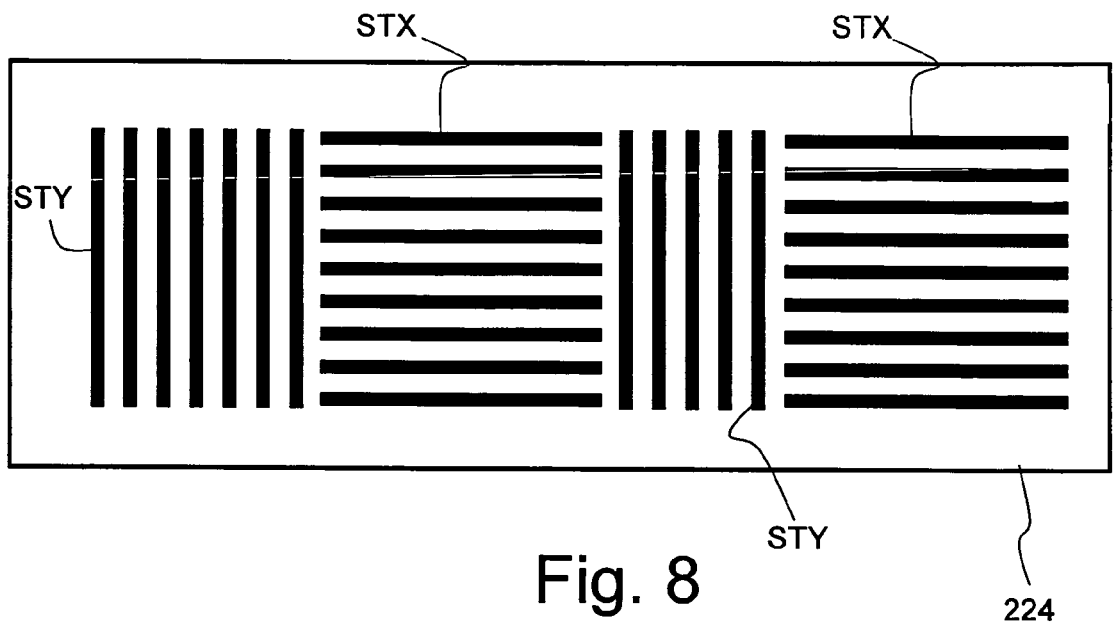
FIG. 8 shows a simplified plan view of a detail of an amplitude mask with periodically arranged structures, to explain a second exemplary embodiment.
Figure 9:
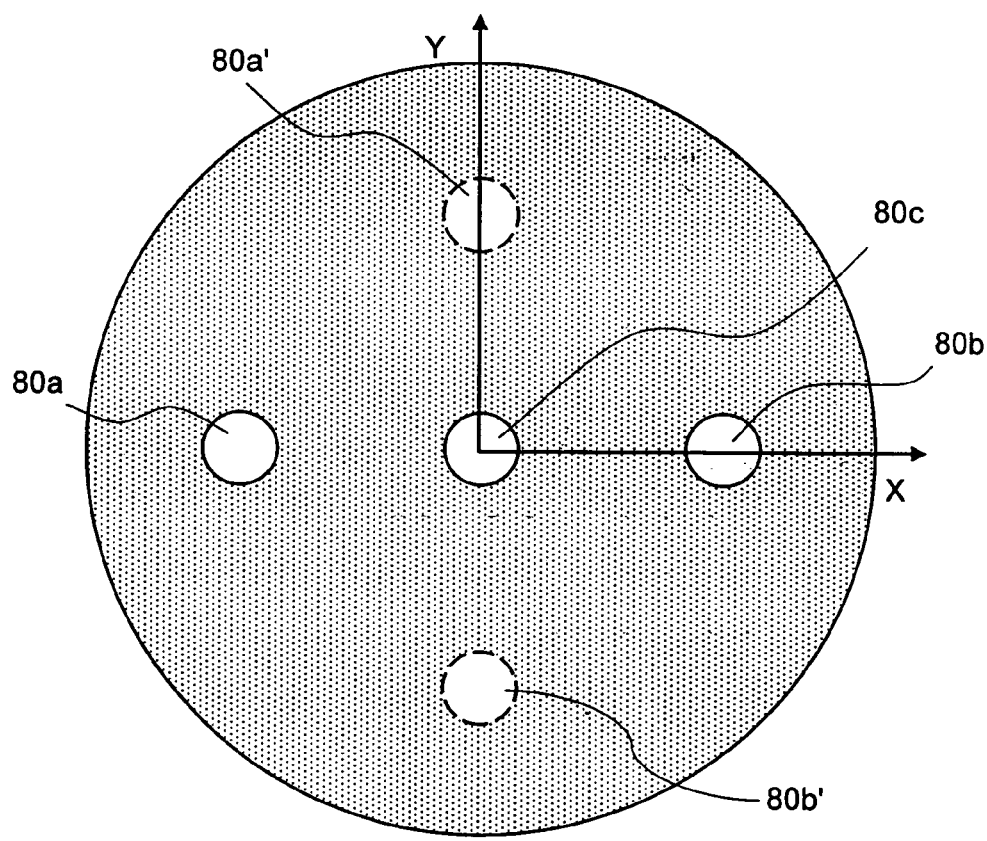
FIG. 9 shows an exit pupil of a projection objective according to the second exemplary embodiment, in a representation analogous to FIG. 3a, when projecting the mask shown in FIG. 8.

For the explanation, it will be assumed that a mask 224 designed as an amplitude mask is to be projected, a detail of this being shown in a simplified representation by FIG. 8. Inside the detail of the mask 224 as shown, a plurality of groups of opaque structures respectively arranged periodically can be seen. Two groups contain elongate structures STY, which are aligned along the Y direction, and two groups contain structures STX which are aligned along the X direction. The groups of periodic structures STX, STY respectively act as an optical grating and are intended to form the diffraction orders m=0, m=+1 and m=−1 at the projection light wavelength being used. With conventional illumination of the mask 224, i.e. a continuous distribution of the illumination angle $\alpha$ between 0° and $\alpha_{max}$, then, in the exit pupil which is shown by FIG. 9 in a representation analogous to FIG. 3a, three regions denoted by 80a, 80b and 80c are illuminated by all the structures STY aligned in the Y direction. These regions 80a, 80b and 80c lie on a diameter through the exit pupil along the X direction. The two outer-lying regions 80a, 80b are respectively illuminated by the diffraction orders m=+1 and m=−1, whereas the zeroth diffraction order illuminates the central region 80c.

Three regions are likewise illuminated by all the structures STX aligned in the X direction, i.e. likewise the central region 80c and the regions 80a', 80b'. The regions 80a', 80b' lie on a diameter through the exit pupil along the Y direction.

It will be assumed below that the mask 224 is illuminated with projection light which is circularly polarized. This has the advantage that structures of equal width but different orientation are imaged with the same contrast. Undesired structure width variations as a function of the structure orientation are thereby avoided, so long as the circular polarization state is maintained.

If the projection light is not already circularly polarized to a sufficiently great extent, or if an original circular polarization state is perturbed by optical elements inside the projection objective; then this generally means that there will be elliptically polarized projection light in the exit pupil.

Figure 10:
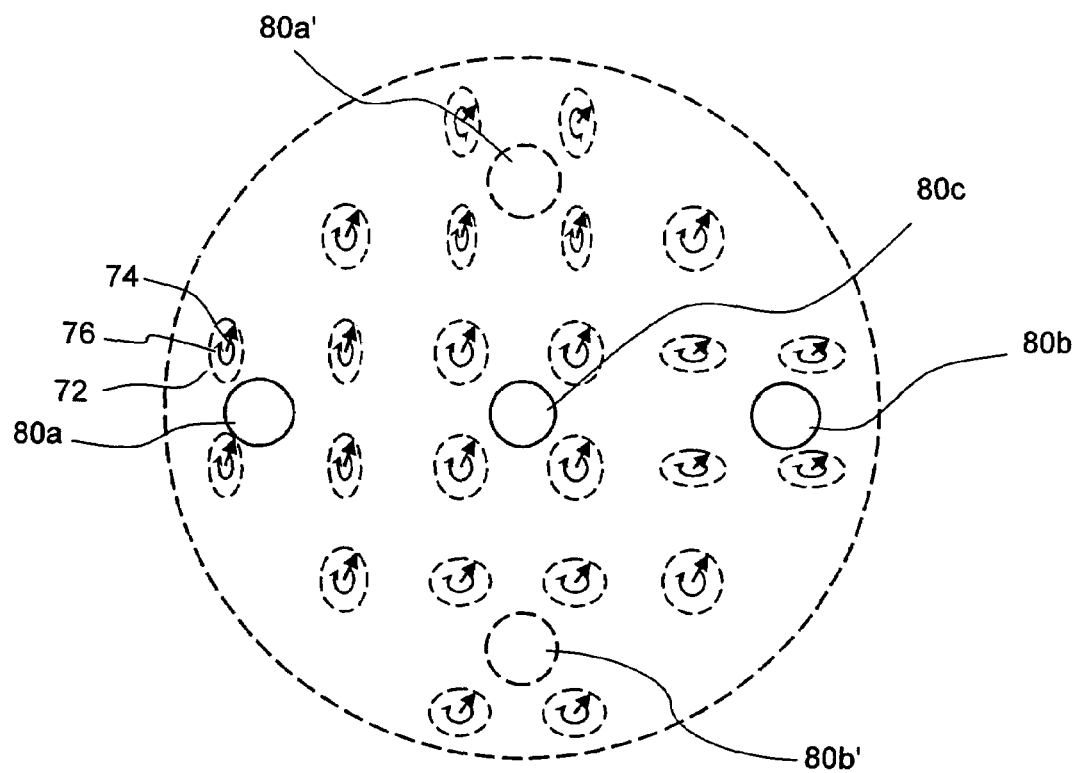
FIG. 10 shows a perturbed polarization distribution in the exit pupil.

FIG. 10 shows the polarization distribution in the exit pupil for a particular field point. It can be seen therein that rather than (still) being circularly polarized, the projection light is now more or less elliptically polarized in the exit pupil owing to the aforementioned reasons. The ellipticity is in this case indicated by the ellipses 72 represented by dashes, in which the vector 74 of the electric field strength rotates as indicated by small arrows 76.

In order to correct such a polarization distribution so that the projection light is circularly polarized over the entire exit pupil, relatively elaborate measures need to be implemented.

For this reason, the locations in the exit pupil which are illuminated with the particular mask 224 are once more determined according to step S3. If the illumination angle distribution is also variable, its setting will be included in the calculation as well.

For a plurality of selected field points, the polarization distribution in the exit pupil is subsequently determined by simulation or by means of a measurement. A simulation is always possible if the essential perturbations of the polarization state are known. For instance, the lattice orientations of crystals which may be used as optical materials, and the polarization-selective effect which reflective layers have, are generally known. If there are also other important causes of perturbations, which cannot be located or whose size cannot be determined, for instance because they do not occur until during the projection operation and cannot be straightforwardly measured on the objective once it has been mounted, then it is expedient to measure the polarization distribution in the exit pupil. Such measurement methods are known, for example, in DE 103 04 822 A1, the disclosure of which is hereby fully incorporated into the subject-matter of the present application.

In order to describe the ellipticity, it is then sufficient to ascertain the amplitude differences and the phase differences between orthogonal polarization directions. These quantities may be derived from the Jones matrix, for example, which can be determined by the method known from the aforementioned DE 103 04 822 A1.

Here again, suitable corrective measures which lead to a better polarization distribution in the exit pupil for the individual field points are subsequently found in a step S5. In this context, for example, it is feasible to use manipulators which can change the polarization distribution of the projection objective even after it has finally been mounted. Such manipulators are described in the as yet unpublished PCT/EP03/11977 in the name of the Applicant, the disclosure of which is likewise fully incorporated into the subject-matter of the present application.

Figure 11:
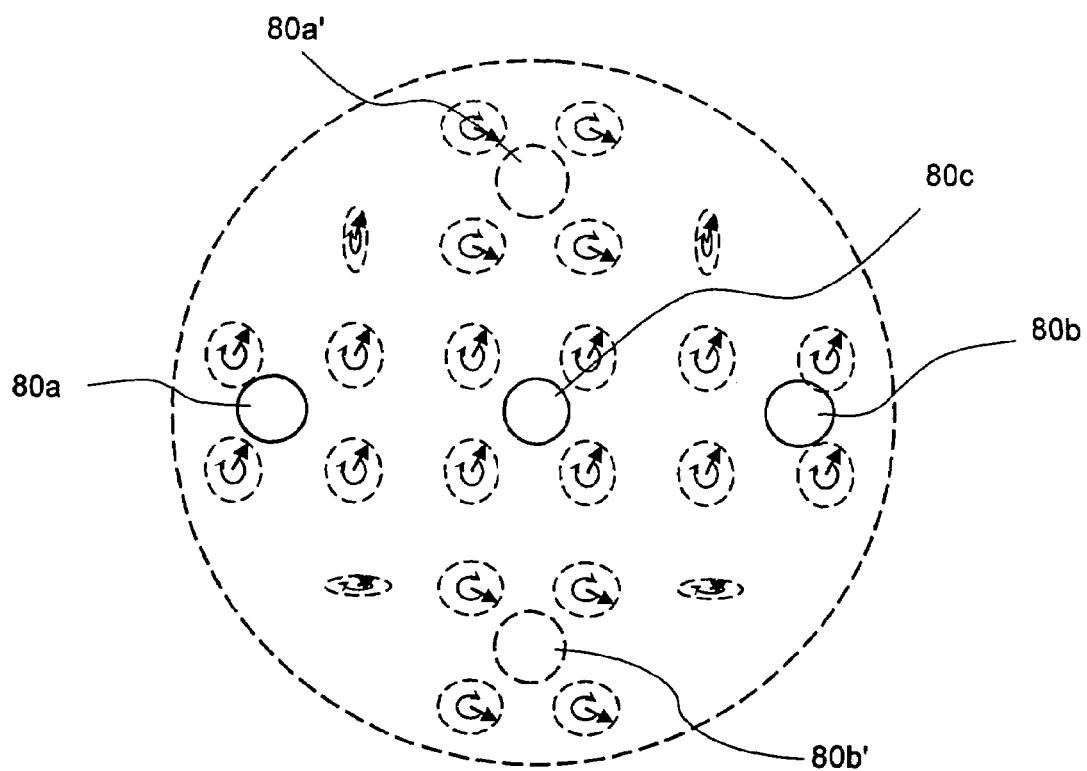
FIG. 11 shows the polarization distribution in the exit pupil as shown in FIG. 10, but after corrective measures according to the invention have been implemented.

FIG. 11 shows the polarization distribution in the exit pupil after the corrective measures have been implemented. It can be seen therein that the projection light is in fact still slightly polarized elliptically as before in the regions 80a, 80b, 80c and 80a', 80b' actually illuminated in the exit pupil. But after the corrective measures have been implemented, the ellipticity is of equal size and orientation inside the regions 80a, 80b, 80c on the one hand, and 80a', 80b' on the other hand, whereas it differs between them with the polarization distribution as shown in FIG. 10. This leads to a significantly higher interferability of the diffraction orders in the image plane, and therefore to a higher contrast during the exposure.

As can furthermore be seen in FIG. 11, the implemented corrective measures once again mean that the polarization state may even be worse outside the regions 80a, 80b, 80c and 80a', 80b'. Yet since the exit pupil is not illuminated therewith the mask 224 being used, this does not affect the imaging properties of the projection objective.

The principles explained above can also be used when initially designing the projection objective. More possibilities are then available for controlled variation of the polarization state in the illuminated regions of the exit pupil. For example, the intrinsic birefringence of cubic crystalline materials can often be optimized during the design of the projection objective by appropriately optimizing the crystal lattice orientations.

For example, such configuration may take into account the fact that in the case of grating-like mask structures oriented along a particular direction, the regions actually illuminated in the exit pupil with conventional illumination angle distributions lie on a diameter of the exit pupil. Since the exact positions of the illuminated regions along the diameter depend inter alia on the mask to be projected, the optimization during the design of the projection objective will be restricted to making the polarization states substantially match at locations on the relevant diameter which lie at equal distances from the centre of the pupil. In this way, a high contrast will be achieved for the relevant structure orientation.

Undesired structure width variations as a function of the structure orientation can be reduced if there is also a similarly good match between the polarization states, for locations on a diameter of the exit pupil on which the illuminated regions lie, in the event of grating-like structures oriented differently. With the masks conventionally used, which contain structures in two mutually orthogonal directions, the two diameters considered here are mutually perpendicular when a conventional illumination angle distribution is set up. In the case of unconventional illumination angle distributions (for example dipole illumination or ring-field illumination), the illuminated regions do-not lie on diameters, but on chords which do not contain the centre of the pupil.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A method for improving the imaging properties of a projection objective of a microlithographic projection exposure apparatus, comprising:
   A. providing a mask to be projected;
   B. determining locations in an exit pupil of the projection objective which are illuminated by projection light during a projection of the mask;
   C. determining, for at least one image point of the projection objective, an actual value of an imaging quantity at least at the locations determined according to step b), wherein the imaging quantity influences the imaging properties of the projection objective;
   D. calculating corrective measures such that the actual value of the imaging quantity approximates a desired value of the imaging quantity at the locations determined according to step b), wherein deviations of the actual value from the desired value are taken into account exclusively at the locations determined according to step b); and
   E. implementing the corrective measures.

2. The method of claim 1, wherein
   the projection exposure apparatus comprises an illumination system for generating projection light with different illumination angle distributions,
   an illumination angle distribution adapted to the mask is selected before step b), and
   the selected illumination angle distribution is taken into account when determining the locations according to step b).

3. The method of claim 2, wherein, if one mask or different masks illuminated with differently set illumination angle distributions are intended to be projected several times in succession on a single photosensitive layer, steps b) to d) are carried out at least occasionally between changes of the illumination angle distribution, and step e) is carried out between each change of the illumination angle distribution.

4. The method of claim 2, wherein, if one mask or different masks illuminated with differently set illumination angle distributions are intended to be projected several times in succession on a single photosensitive layer, steps b) to d) are carried out once for each illumination angle distribution, and, if necessary, for each mask, before commencing the projection operation, and in that only step e) is carried out between each change of the illumination angle distribution during the projection operation.

5. The method of claim 1, wherein the determination of the actual value of the imaging quantity according to step c) is carried out by a measurement.

6. The method of claim 1, wherein the determination of the actual value of the imaging quantity according to step c) is carried out by a simulation.

7. The method of claim 1, wherein the imaging quantity is a wavefront profile.

8. The method of claim 7, wherein the wavefront profile is measured using a wavefront detector.

9. The method of claim 8, wherein the wavefront detector is a shearing interferometer.

10. The method of claim 1, wherein the imaging quantity is a quantity characterizing the polarization state.

11. The method of claim 10, wherein the quantity characterizing the polarization state is measured using a polarization analyzer arrangement that comprises a pupil-resolving polarization detector.

12. The method of claim 10, wherein the imaging quantity is the difference between amplitudes of orthogonal polarization states.

13. The method of claim 10, wherein the imaging quantity is the difference between phases of orthogonal polarization states.

14. The method of claim 10, wherein the locations determined according to step b) are at least approximately point-symmetric with respect to an optical axis of the projection objective.

15. The method of claim 14, wherein the locations determined in step b) are at least approximately arranged on a diameter through the exit pupil.

16. The method of claim 14, wherein the corrective measures according to step e) are calculated such that the actual values of the imaging quantity are at least approximately identical at the locations determined in step b).

17. The method of claim 1, wherein steps c) to e) are carried out in an exposure pause between two exposures.

18. The method of claim 1, wherein the corrective measures comprise a position change of at least one optical element contained in the projection objective.

19. The method of claim 1, wherein the corrective measures comprise a shape change of at least one optical element contained in the projection objective.

20. The method of claim 1, wherein the corrective measures comprise a change of a diaphragm aperture contained in the projection objective.

21. The method of claim 1, wherein the corrective measures comprise a pressure change inside at least a part of the projection objective.

22. The method of claim 1, wherein the corrective measures comprise a position change of the mask.

23. The method of claim 1, wherein the corrective measures comprise a change of the illumination angle distribution generated by an illumination system of the projection exposure apparatus.

24. The method of claim 23, wherein the illumination angle distribution is changed by a transmission filter, which is arranged in or close to a pupil plane in the illumination system.

25. The method of claim 23, wherein the illumination angle distribution is changed such that regions in the exit pupil of the projection objective, where the actual value of the imaging quantity deviates from the desired value by more than a predetermined amount, are no longer illuminated by projection light.

26. The method of claim 1, wherein step c) is repeated after step e).

27. A method for designing a projection objective of a microlithographic projection exposure apparatus, in which an illuminated mask is projected by the projection objective onto a photosensitive layer, said method comprising:
   A. determining, by simulation, locations in an exit pupil of the projection objective which are illuminated by projection light during a projection of the mask;

B. determining, for at least one image point of the projection objective, a simulated value of an imaging quantity at least at the locations determined according to step a), wherein the imaging quantity influences the imaging properties of the projection objective;

C. calculating measures such that the simulated value of the imaging quantity approximates a desired value of the imaging quantity at the locations determined according to step a), wherein deviations of the simulated value from the desired value are taken into account exclusively at the locations determined according to step a); and D. designing the projection objective according to the measures calculated in step c).

28. The method of claim 27, wherein the measures comprise the selection of optical materials.

29. The method of claim 27, wherein the measures comprise the crystal lattice orientation alignment of crystalline optical materials.

30. A microlithographic projection exposure apparatus for imaging a mask onto a photosensitive layer, comprising:

A. a projection objective having an exit pupil,

B. a measuring device for measuring, for at least one image point of the projection objective, a value of an imaging quantity at least at locations in the exit pupil which are illuminated by projection light during a projection of the mask, wherein the imaging quantity influences the imaging properties of the projection objective;

C. a comparator which compares the measured value with a desired value for the imaging quantity;

D. a correcting device which implements corrective measures such that the at least one measured value approximates the desired value, wherein deviations of the measured value from the desired value are taken into account exclusively at the locations illuminated in the exit pupil.

31. The projection exposure apparatus of claim 30, comprising an illumination system for generating projection light with different illumination angle distributions.

32. The projection exposure apparatus of claim 30, wherein the measuring device is a wavefront detector comprising a diffraction grating and an electronic image detector.

33. The projection exposure of claim 30, wherein the correcting device comprises a manipulator for changing the position of at least one optical element contained in the projection objective.

34. The projection exposure apparatus of claim 30, wherein the correcting device comprises an actuator for changing the shape of at least one optical element contained in the projection objective.

35. The projection exposure apparatus of claim 30, wherein the correcting device comprises a diaphragm positioned in a pupil plane of the projection objective and an actuator for varying an aperture of the diaphragm.

36. The projection exposure apparatus of claim 30, wherein the correcting device comprises a pressure unit for changing the pressure inside at least a part of the projection objective.

37. The projection exposure of claim 30, wherein the correcting device is configured to modify an illumination angle distribution generated by an illumination system of the projection exposure apparatus.

38. The projection exposure apparatus of claim 37, wherein the correcting device comprises a transmission filter that is arranged in or close proximity to a pupil plane in the illumination system.

39. A method for the microlithographic production of microstructure components, comprising:

A. providing a photosensitive layer;

B. providing a mask which contains structures to be imaged;

C. providing a projection exposure apparatus according to claim 30; and

D. projecting at least a part of the mask onto a region on the photosensitive layer using the projection exposure apparatus.

* * * * *